(12) United States Patent
Saigoh et al.

(10) Patent No.: US 7,683,412 B2
(45) Date of Patent: Mar. 23, 2010

(54) SEMICONDUCTOR DEVICE HAVING A FERROELECTRIC CAPACITOR

(75) Inventors: Kaoru Saigoh, Kawasaki (JP); Kouichi Nagai, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 464 days.

(21) Appl. No.: 11/362,844

(22) Filed: Feb. 28, 2006

(65) Prior Publication Data

US 2007/0020803 A1  Jan. 25, 2007

(30) Foreign Application Priority Data

Jul. 19, 2005 (JP) .............................. 2005-209093

(51) Int. Cl.
*H01L 27/108* (2006.01)

(52) U.S. Cl. ..................... 257/296; 257/295; 257/310; 257/789; 257/795; 257/E23.121; 257/E23.144

(58) Field of Classification Search ................ 257/295, 257/296, 310, 789, 795, E23.144, E23.117, 257/E23.121
See application file for complete search history.

(56) References Cited

U.S. PATENT DOCUMENTS

| | | | |
|---|---|---|---|
| 5,186,378 A | 2/1993 | Alfaro | |
| 5,412,002 A | 5/1995 | Enomoto et al. | |
| 5,654,567 A * | 8/1997 | Numata et al. | ............... 257/306 |
| 5,672,549 A | 9/1997 | Minami et al. | |
| 5,985,455 A | 11/1999 | Tokunaga et al. | |
| 6,300,686 B1 | 10/2001 | Hirano et al. | |
| 6,486,006 B2 | 11/2002 | Hirano et al. | |
| 6,524,887 B2 | 2/2003 | Li et al. | |
| 6,809,268 B2 * | 10/2004 | Hayashi et al. | ............. 174/260 |
| 6,844,633 B2 | 1/2005 | Takado | |

FOREIGN PATENT DOCUMENTS

| | | | |
|---|---|---|---|
| CN | 1156329 A | | 8/1997 |
| CN | 1214545 A | | 4/1999 |
| CN | 1401727 A | | 3/2003 |
| JP | 5-287054 A | | 11/1993 |
| JP | 6-204299 A | | 7/1994 |
| JP | 6-239967 A | | 8/1994 |
| JP | 11-243179 A | | 9/1999 |
| JP | 2001-89643 | | 4/2001 |
| JP | 2001089643 A | * | 4/2001 |
| JP | 2002-179763 | | 6/2002 |
| JP | 2003-286335 A | | 10/2003 |

OTHER PUBLICATIONS

Chinese Office Action dated Nov. 9, 2007, issued in corresponding Chinese patent application No. 200610066109.0.
Japanese Office Action dated Apr. 28, 2009 issued in corresponding Japanese Application No. 2005-209093.

* cited by examiner

*Primary Examiner*—Matthew E Warren
(74) *Attorney, Agent, or Firm*—Westerman, Hattori, Daniels & Adrian, LLP

(57) ABSTRACT

An ultra-thin semiconductor chip of an FeRAM, which is miniaturized and highly integrated with characteristic degradation of a ferroelectric capacitor suppressed though a thin package structure is applied to the FeRAM is realized. The semiconductor chip is molded up by using a sealing resin with a filler content set at a value in a range of 90 weight % to 93 weight % to produce a package structure.

7 Claims, 13 Drawing Sheets

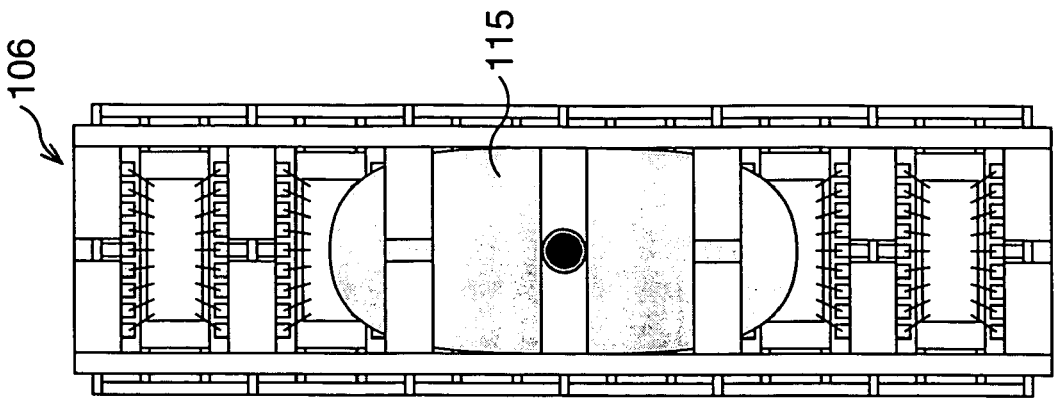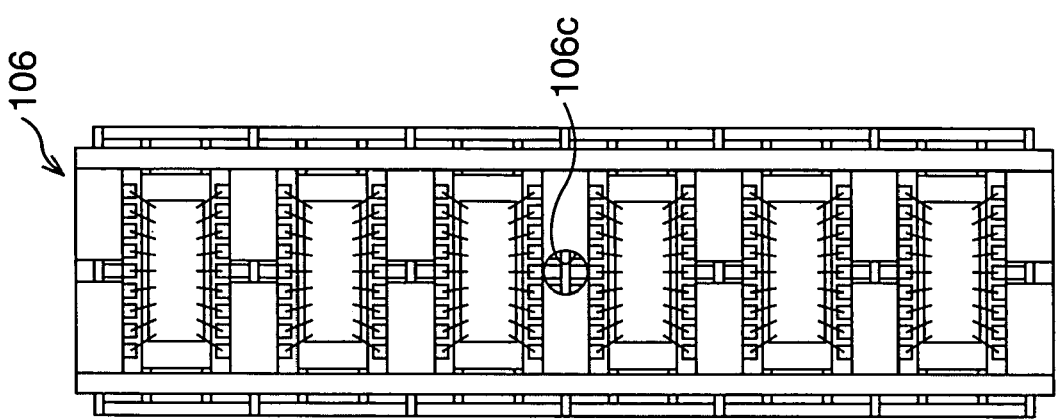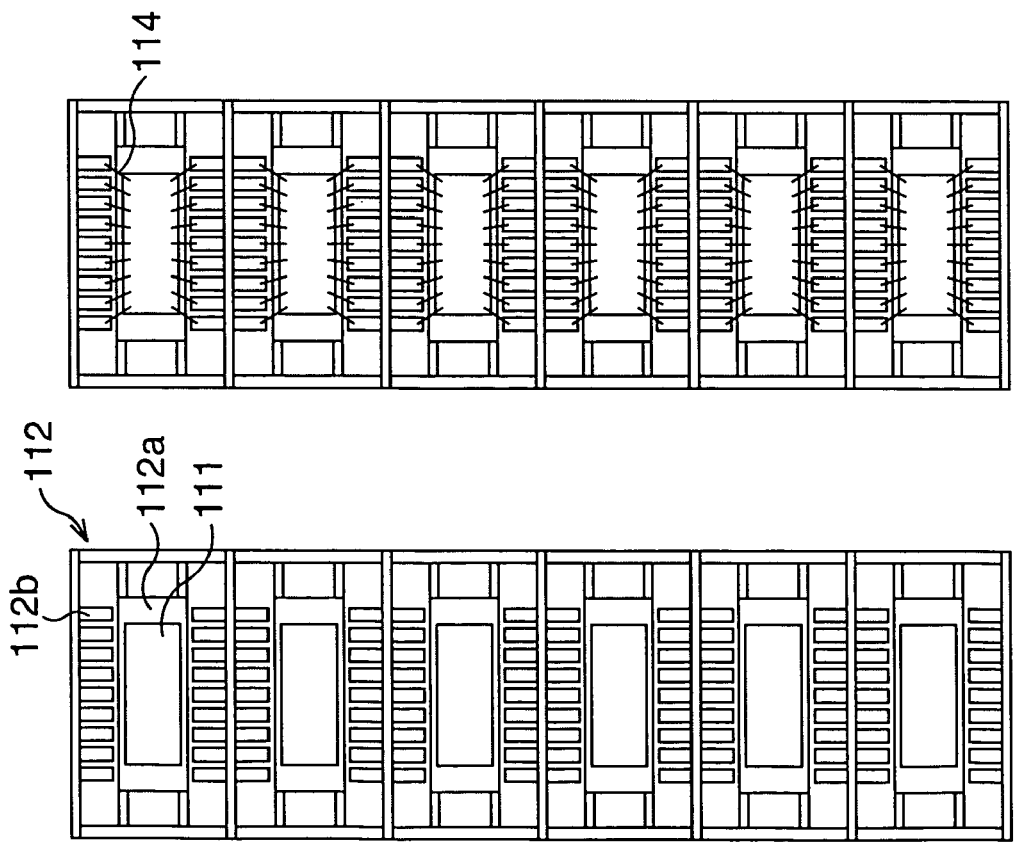

FIG. 8A
FIG. 8B
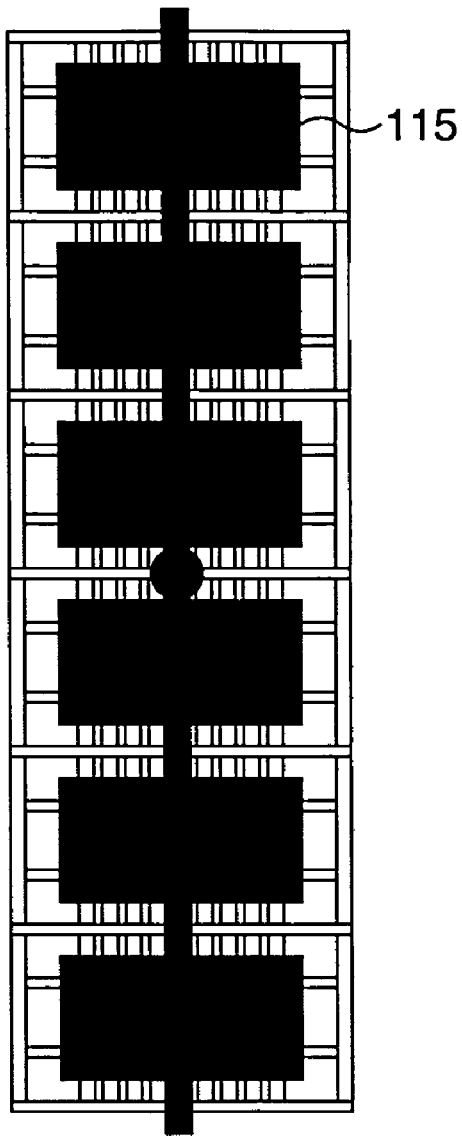
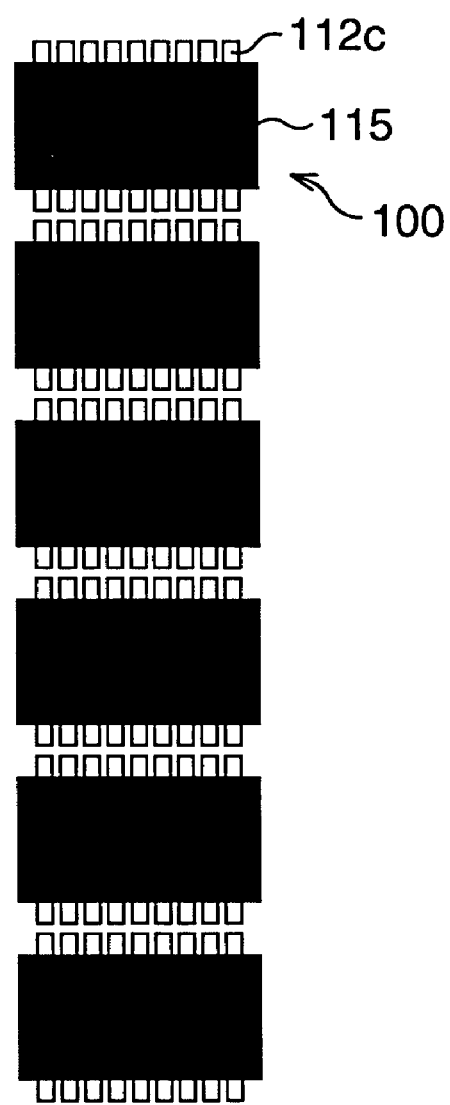

and the surface-mount pack-
SEMICONDUCTOR DEVICE HAVING A FERROELECTRIC CAPACITATOR

CROSS-REFERENCE TO RELATED APPLICATIONS

This application is based upon and claims the benefit of priority from the prior Japanese Patent Application No. 2005-209093, filed on Jul. 19, 2005, the entire contents of which are incorporated herein by reference.

BACKGROUND OF THE INVENTION

1. Field of the Invention

The present invention relates to a semiconductor device having a package structure and a manufacturing method of the same.

2. Description of the Related Art

In semiconductor devices, the sizes of the semiconductor chips become larger as the integration degrees of the integrated circuits become higher, and the surface-mount packages are gradually changed from DIP (Dual Inline Package) to thin flat packages such as SOP (Small Outline L-leaded Package), SOJ (Small Outline J-Leaded Package), PLCC (Plastic Leaded Chip Carrier), and especially QFP (Quad Flat Package). Now the industrial tendency changes to more aggregated packages such as BGA (Ball Grid Array), CSP (Chip Size Package), FC (Flip Chip) and non-lead packages.

Recently, in order to respond to requests for microfabrication and high integration, thin package structures represented by TSOP (Thin Small Outline L-Leaded Package) attract attention. TSOP is an ultra-thin SOP of which package mounting height is 1.27 mm or less, and is expected to be applied to an ultra-thin electronic apparatus of a card type or the like.

Electronic components such as diodes, transistors and integrated circuits are sealed by thermosetting resins. Especially in integrated circuits (IC), an epoxy resin, which has excellent heat resistance and moisture resistance as such a thermosetting resin, is frequently used as a sealing resin.

As the sealing resin, an epoxy resin composition exhibiting very large heat dissipation on encapsulating a high power generating IC chip (see Japanese Patent Application Laid-open No. 2002-179763), an epoxy resin composition excellent in moisture resistance and long term stability and including favorable characteristics for a semiconductor sealing material, a laminate, a solder resist and the like (see Japanese Patent Application Laid-open No. 5-163328), an epoxy resin composition excellent in fillability for filling gaps in an odd-shaped package with filling ratios of a top surface and a bottom surface differing and excellent in productivity and moisture resistance-reliability after mounting by using only fine globular silica having an average particle size of 5 μm or less, and the like (see Japanese Patent Application Laid-open No. 2001-89643) have been developed.

In SOP, adhesion between a stage and a sealing resin is weak, and therefore, peeling-off of the sealing resin from the stage back surface becomes a problem. Therefore, in order to enhance adhesion of the stage and the sealing resin, a sealing resin with a large filler amount is generally used as the sealing resin. The filler amount mentioned here indicates the filler amount dissolved in the sealing resin.

On the other hand, in TSOP, a semiconductor chip easily peels off from a stage, and therefore, a sealing resin with high adhesion strength is used. However, peeling-off of the sealing resin from the stage does not become a problem. Therefore, it is general to use a sealing resin at low cost with a small filler amount, which is easy to fill. If a resin with a large filler amount is used as a sealing resin in TSOP, cost is increased, and the sealing resin does not reach the end of a mold, which causes the problem of fine pin holes formed in the surface of the sealing resin, or the like. Therefore, resins with low filler contents are practically used for TSOP as sealing resins.

In the semiconductor memories of recent years, a high-speed non-volatile memory with low power consumption and a large number of rewrites, which is called FeRAM using a ferroelectric capacitor having ferroelectric characteristics attracts attention, and is expected to develop hereafter. However, the ferroelectric capacitor has the characteristics that it is weak in water, hydrogen and stress. Therefore, a measure for preventing water/hydrogen from entering the inside of a semiconductor element is essential. As a prevention measure, necessity of preventing entrance of water/hydrogen from the surface of the protection material especially after being packaged is considered to be important.

The resin with a small filler amount which is used in TSOP does not become a problem when used as sealing resins in ordinary devices. However, the resins with small filler amounts have a large generation amount of gases with hydrogen as a component due to high solvent ratios. Therefore, when a resin with a small filler amount is applied to TSOP of a FeRAM, there arises the problem of having an adverse effect on the ferroelectric capacitor which is weak against hydrogen.

When the resin with a small filler amount is used for the sealing resin, the protection material formed is in the porous (non-dense) state, and therefore, it has the characteristic of absorbing water. By the effect of the absorbed water, there is the problem that the sealing resin expands to cause a crack and the semiconductor element is broken.

Warpage occurs to a sealing resin by expansion pressure as a result of absorbing water, compression (or contraction) stress is applied to an inside of the semiconductor chip by the expansion pressure, and the stress is exerted on the ferroelectric capacitor, thus causing the serious problems that the data holding function is lost, the data cannot be read out, a malfunction occurs and the like.

SUMMARY OF THE INVENTION

The present invention is made in view of the above described problems, and has an object to provide a semiconductor device that realizes an ultra-thin semiconductor chip of an FeRAM which is miniaturized and highly integrated with characteristic degradation of a ferroelectric capacitor suppressed even though a thin package structure is applied to the FeRAM, and a manufacturing method of the same.

A manufacturing method of a semiconductor device of the present invention includes a step of forming a semiconductor chip including a memory cell constituted by arranging a plurality of semiconductor elements each including a ferroelectric capacitor structure constituted by sandwiching a ferroelectric film having ferroelectric characteristics with two electrodes, and a step of sealing the semiconductor chip by using a sealing resin with a filler content of 90 weight % or more to form a thin package structure with a mounting height of 1.27 mm or less. 90 weight % mentioned here indicates the ratio of the filler weight with respect to the weight of the entire sealing resin containing the fillers.

A semiconductor device of the present invention includes a semiconductor chip including a memory cell constituted by arranging a plurality of semiconductor elements each including a ferroelectric capacitor structure constituted by sandwiching a ferroelectric film having ferroelectric characteristics with two electrodes, and a sealing resin covering the above described semiconductor chip to seal it, the semiconductor device constructing a thin package structure with a mounting height of 1.27 mm or less, and the above described sealing resin has a filler content of 90 weight % or more.

BRIEF DESCRIPTION OF THE DRAWINGS

FIGS. 7A to 7D are schematic plane-views showing states of semiconductor chips in predetermined steps of the respective steps in FIGS. 6A to 6G;

FIGS. 8A and 8B are schematic plane views showing states of the semiconductor chips in predetermined steps of the respective steps in FIGS. 6A to 6G, which continue from FIGS. 7A to 7D;

DETAILED DESCRIPTION OF THE PREFERRED EMBODIMENTS

Basic Gist of the Present Invention

Figure 1A:
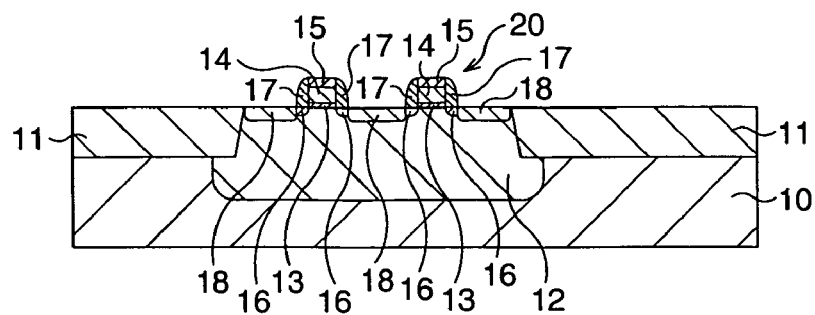
FIGS. 1A to 1D are schematic sectional views showing a constitution of a planar type FeRAM with its manufacturing method in sequence of steps.

In the present invention, in order to realize further microfabrication/high integration of an FeRAM, compensation of the weak point of the ferroelectric capacitor that the ferroelectric capacitor is easily affected by water, hydrogen and stress is considered as the matter of priority, on application of a FeRAM to a thin package structure represented by TSOP (the package structure with the package mounting height of 1.27 mm or less). The characteristic degradation caused by water and hydrogen in a ferroelectric capacitor tends to be a fatal defect to the FeRAM, and therefore, suppression of the characteristic degradation is considered first. The inventor of the present invention has found out that the resin having high solvent content in substance ratio generates a large amount of water at a time of cure from the fact that hydrogen and water generate at a time of cure of the sealing resin. From this, the inventor of the present invention has conceived a use of the sealing resin with a comparative low solvent ratio, concretely, the sealing resin containing 90 weight % or more of fillers.

The higher the content of the fillers of the sealing resin, the smaller the solvent amount existing in the sealing resin. Thereby, the amount of water/hydrogen/gas evaporated at the time of cure of the sealing resin decreases, and therefore, the characteristic degradation of the ferroelectric capacitor is not caused.

Further, in the present invention, in order to remove the bad influence caused by increasing the filler content in the sealing resin as much as possible, the following measures are taken.

(1) The sealing resin with a filler content set at the value within the range of 90 weight % to 93 weight % is used.

By specifying the value to be 93 weight % or less, supply of the sealing resin to the end of the mold can be promoted in a packaging (molding) step.

(2) Globular fillers are used as the fillers in the sealing resin.

By using the globular fillers, a damage to the surface of the semiconductor chip is reduced when the sealing resin is poured, flowability into the mold is enhanced, and even the sealing resin with a high filler content easily flows.

In this case, the fillers are preferably constituted of globular fillers of two kinds or more in different sizes. The sealing resin in which as two kinds of globular fillers in different sizes, the diameter of the globular filler in the small size is substantially 0.35 times as large as the diameter of the globular filler: in the large size, for example, and the abundance ratios of the globular fillers in the small size and the globular fillers in the large size in the sealing resin are substantially the same is used. The sealing resin in which of all the globular fillers, 99% or more have the diameters in the range of 3 μm to 9 μm is used.

By using the sealing resin containing the globular fillers as described above, the gaps among the fillers are reduced as much as possible. Accordingly, the influence of water entering the gaps decreases, and therefore, expansion of the sealing resin itself can be suppressed. By suppressing the expansion, compression (or contraction) stress is reduced.

(3) The sealing resin containing a single kind of fillers made of the same material or the combination of not less than two kinds of fillers made of different materials is preferably used.

(4) In a step of sealing a semiconductor chip with the sealing resin, the pressure at which the sealing resin is poured into the mold is set at 75 kg/cm$^2$ or higher.

By setting the pressure at which the sealing resin is poured into the mold at the comparatively high value like this, the sealing resin can be sufficiently supplied to the end of the mold even if the viscosity of the sealing resin increases as a result of increasing the filler content of the sealing resin, and reduction in yield at the time of packaging can be avoided.

(5) In the step of sealing the semiconductor chip with the sealing resin, the temperature of the mold at the time of pouring the sealing resin is adjusted to 140° C. to 170° C.

Conventionally, the sealing resin is poured into the mold at 175±5° C. and the resin surface is cured by the thermal treatment for about one to two minutes. When the sealing resin with a high filler content is used in the present invention on the other hand, if the surface of the mold is at high temperature, the adverse effect that the surface of the poured sealing resin is cured in a short time occurs, which causes a crack. In the present invention, by setting the mold temperature at the low temperature as described above, occurrence of a crack can be prevented without losing flowability of the sealing resin in a short time.

(6) In the step of sealing the semiconductor chip with the sealing resin, the first thermal treatment that is performed at a temperature which is sufficient to complete the cross-linking reaction in the sealing resin, and the second thermal treatment that is performed at a lower temperature than the first thermal treatment before and after the first thermal treatment respectively are applied to the sealing resin which seals the semiconductor chip. In concrete, the first thermal treatment is carried out at 175° C. for about one hour, the second thermal treatment that is performed before the first thermal treatment is carried out at 150° C. for about two hours, and the second thermal treatment that is performed after the first thermal treatment is carried out at 150° C. for about one hour.

When the sealing resin containing a low filler content, for example, 60 weight % to 70 weight % of fillers (the sealing resin conventionally used when TSOP is applied to an FeRAM), thermal treatment at 175±5° C. for about four to five hours is performed to sufficiently evaporate a relatively large amount of solvent. In order to aim at perfection of the cross-linking reaction in the sealing resin, thermal treatment at 175° C. for about one hour is necessary and sufficient, and water and gases contained in the sealing resin are discharged by the thermal treatment of the remaining time. Since in a ferroelectric, thermal treatment at a high temperature becomes a factor which promotes a reducing reaction with hydrogen, the first thermal treatment is carried out to complete the cross-linking reaction in the sealing resin, and the second thermal treatment aiming at discharge of water and gases contained in the sealing resin is carried out before and after the first thermal treatment respectively.

(7) In a step of forming a semiconductor chip, a wire bonding treatment is applied to the semiconductor chip at a connection temperature of 220° C. or lower.

By reducing the treatment temperature at the time of wire bonding as much as possible, the characteristic degradation of the ferroelectric capacitor can be suppressed to a minimum.

Embodiments to Which the Present Invention is Applied

Concrete embodiments to which the present invention is applied will be described in detail with reference to the drawings.

First Embodiment

In this embodiment, a semiconductor device in which TPOP that is a thin package structure (mounting height is 1.27 mm or less) is applied to an FeRAM and a manufacturing method of the same are disclosed.

First, a process of forming an FeRAM above a silicon semiconductor substrate (silicon wafer) will be described in detail. Here, a so-called planar type is shown as an example as the FeRAM. FIGS. 1A to D to FIG. 4 are schematic sectional views showing the constitusion of the planar type FeRAM with its manufacturing method in the sequence of steps.

First, as shown in FIG. 1A, a MOS transistor 20 which functions as a selection transistor is formed above the silicon semiconductor substrate 10.

To be more precise, an element isolation structure 11 is formed on a surface layer of the silicon semiconductor substrate 10 by, for example, the STI (Shallow Trench Isolation) method to define an element active region.

Next, an impurity that is boron (B) in this case is ion-implanted into the element active region under the condition of, for example, the dose amount of $3.0 \times 10^{13}/cm^2$ and the acceleration energy of 300 keV to form a well 12.

Next, a thin gate insulating film 13 of the film thickness of about 3.0 nm is formed on the element active region by thermal oxidation or the like, then a polycrystalline silicon film of the film thickness of about 180 nm and, for example, a silicon nitride film of the film thickness of about 29 nm are deposited on the gate insulating film 13 by the CVD method, and the silicon nitride film, the polycrystalline silicon film and the gate insulating film 13 are worked into the shape of an electrode by lithography and the subsequent dry etching, whereby a gate electrode 14 is formed on the gate insulating film 13 by patterning. At this time, a cap film 15 constituted of a silicon nitride film is simultaneously formed on the gate electrode 14 by patterning.

Next, an impurity that is As in this case is ion-implanted into the element active region with the cap film 15 as a mask under the condition of, for example, the dose amount of $5.0 \times 10^{14}/cm^2$ and the acceleration energy of 10 keV to form a so-called LDD region 16.

Next, for example, a silicon oxide film is deposited on the entire surface by the CVD method, and the silicon oxide film is so-called etched back, whereby a side wall insulating film 17 is formed with the silicon oxide film left on only the side surfaces of the gate electrode 14 and the cap film 15.

Figure 1B:
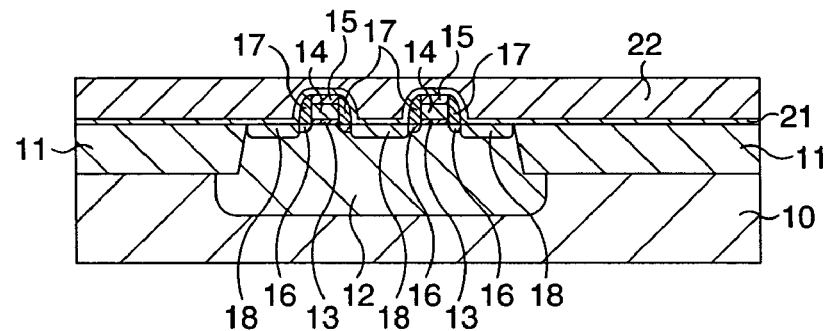

Next, with the cap film 15 and the side wall insulating film 17 as a mask, an impurity that is P in this case is ion-implanted into the element active region under the condition which makes the impurity concentration higher than that of the LDD region 16, for example, under the condition of the doze amount of $5.0 \times 10^{14}/cm^2$ and the acceleration energy of 13 keV, whereby a source/drain region 18 superimposed on the LDD region 16 is formed to complete the MOS transistor 20. In FIG. 1B and thereafter, the silicon semiconductor substrate 10, the well 12, the element isolation structure 11, the LDD region 16 and the source/drain region 18 are omitted.

Subsequently, as shown in FIG. 1B, a protection film 21 of the MOS transistor 10 and a first interlayer insulating film 22 are formed.

In detail, the protection film 21 and the interlayer insulating film 22 are sequentially deposited in such a manner as to cover the MOS transistor 20. In this case, as the protection film 21, a silicon oxide film is used as the material and is deposited to the film thickness of about 20 nm by the CVD method. As the first interlayer insulating film 22, a stacked structure in which, for example, a plasma SiO film (film thickness of about 20 nm), a plasma SiN film (film thickness of about 80 nm) and a plasma TEOS film (film thickness of about 1000 nm) are sequentially deposited is formed, and after stacking, the first interlayer insulating film 22 is polished until the film thickness becomes about 700 nm by CMP.

Figure 1C:
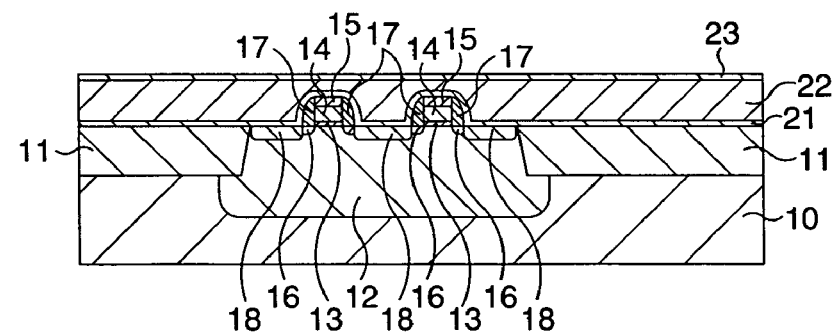

Subsequently, as shown in FIG. 1C, an orientation property improving film 23 for a lower electrode of a ferroelectric capacitor structure 30 which will be described later is formed.

To be more precise, for example, a silicon oxide film is deposited on the first interlayer insulating film 22 to form the orientation property improving film 23 is formed.

Figure 1D:
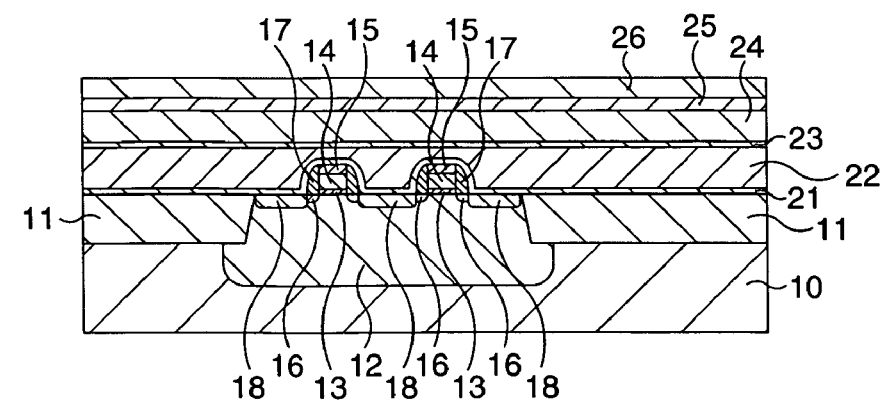

Subsequently, as shown in FIG. 1D, a lower electrode layer 24, a ferroelectric film 25 and an upper electric layer 26 are sequentially formed.

To be more precise, for example, a Ti film with the film thickness of about 20 nm and a Pt film with the film thickness of about 150 nm are sequentially deposited by the sputtering method first, and the lower electrode layer 24 is formed in a stacked structure of the Ti film and the Pt film. Then, the ferroelectric film 25 constituted of, for example, PZT which is a ferroelectric is deposited on the lower electrode layer 24 to the film thickness of about 200 nm by the RF sputtering method. Then, the RTA treatment is applied to the ferroelectric film 25 to crystallize the ferroelectric film 25. Next, the upper electrode layer 26 with, for example, $IrO_2$ that is a conductive oxide as the material is deposited on the ferroelectric film 25 to the film thickness of about 200 nm by the reactive sputtering method. As the material of the upper electrode layer 26, Ir, Ru, $RuO_2$, $SrRuO_3$ and the other conductive oxides, and stacked structures of them may be adopted instead of $IrO_2$.

Figure 2A:
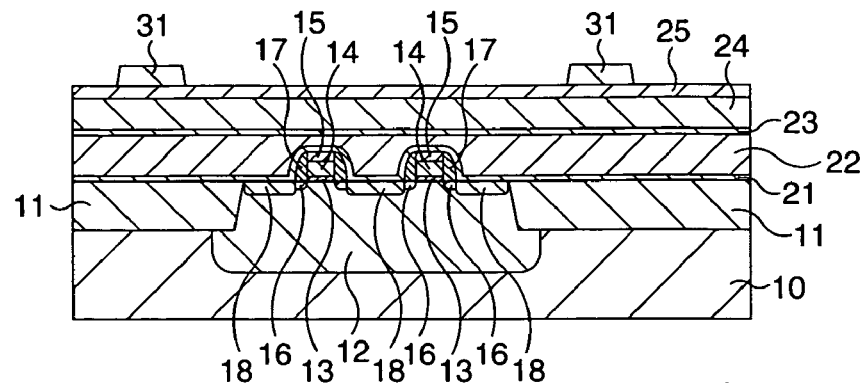
FIGS. 2A to 2D are schematic sectional views showing the constitution of the planar type FeRAM with its manufacturing method in sequence of steps, which continue from FIGS. 1A to 1D.

Subsequently, as shown in FIG. 2A, an upper electrode 31 is formed by patterning.

To be more precise, the upper electrode layer 26 is worked into a plurality of electrode shapes by lithography and the subsequent dry etching to form the upper electrode 31 by patterning.

Figure 2B:
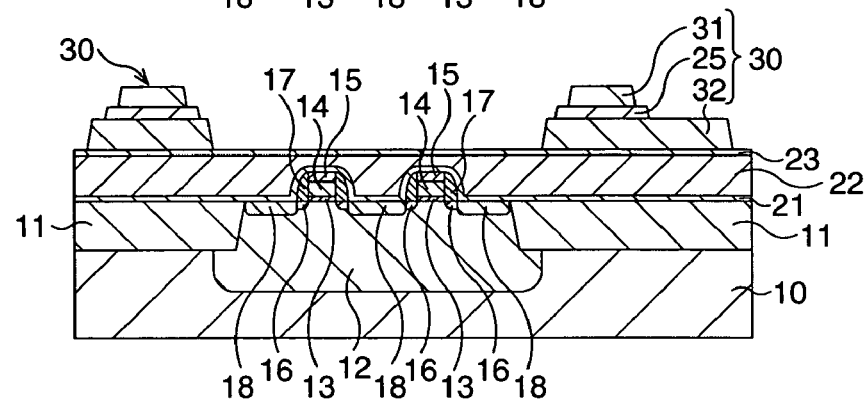

Subsequently, as shown in FIG. 2B, a ferroelectric capacitor structure 30 is formed by working the ferroelectric film 25 and the lower electrode layer 24.

To be more precise, the ferroelectric film 25 is aligned with the upper electrode 31 first, and is worked by lithography and the subsequent dry etching to be in a little larger size than that of the upper electrode 31.

Next, the lower electrode layer 24 is aligned with the worked ferroelectric film 25, and is worked by lithography and the subsequent dry etching to be in a little larger size than that of the ferroelectric film 25 to form the lower electrode 32 by patterning. Thereby, the ferroelectric film 25 and the upper electrode 31 are sequentially stacked on the lower electrode 32, and the ferroelectric capacitor structure 30 in which the lower electrode 32 and the upper electrode 31 are capacitatively coupled via the ferroelectric film 25 is completed.

Figure 2C:
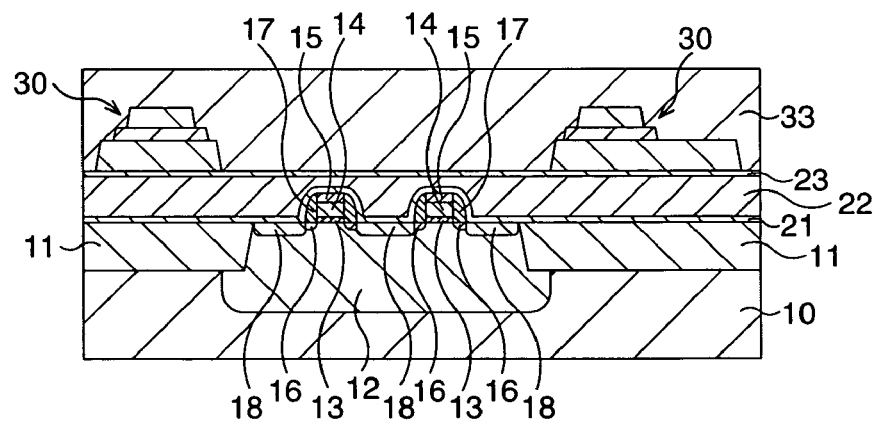

Subsequently, as shown in FIG. 2C, a second interlayer insulating film 33 is formed.

To be more precise, the second interlayer insulating film 33 is formed in such a manner as to cover the ferroelectric capacitor structure 30. In this case, as the second interlayer insulating film 33, for example, a plasma TEOS film is deposited to the film thickness of about 1400 nm, and thereafter, it is polished by CMP until the film thickness becomes about 1000 nm. After the CMP, plasma annealing treatment of, for example, $N_2O$ is applied for the purpose of dehydration of the second interlayer insulating film 33.

Figure 2D:
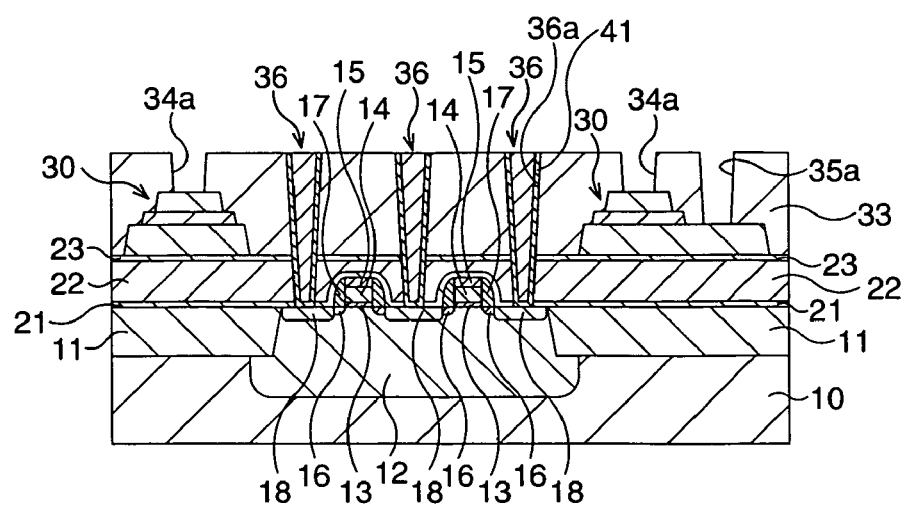

Subsequently, as shown in FIG. 2D, a plug 36 connected to the source/drain region 18 of the transistor structure 10 and via holes 34a and 35a to the ferroelectric capacitor structure 30 are formed.

First, a via hole 36a to the source/drain region 18 of the transistor structure 10 is formed.

To be more precise, with the source/drain region 18 as the etching stopper, the second interlayer insulating film 33, the orientation property improving film 23, the first interlayer insulating film 22 and the protection film 21 are worked by lithography and the subsequent dry etching until a part of the surface of the source/drain region 18 is exposed, and the via hole 36 with the diameter of about 0.3 µm, for example, is formed.

Next, the plug 36 is formed.

To be more precise, after RF pretreatment corresponding to several tens nm in the etching basis of an ordinary oxide film, corresponding to about 10 nm in this case is performed, for example, a TiN film is deposited to the film thickness of about 75 nm by the sputtering method in such a manner as to cover each wall surface of the via hole 36a to form a base film (glue film) 41. Then, for example, a W film is formed in such a manner as to fill the via hole 36 via the glue film 41 by the CVD method. Thereafter, the W film and the glue film 41 are polished by CMP with the second interlayer insulating film 33 as the stopper, and the plug 36 with the via hole 36a is filled with W via the glue film 41 is formed.

Next, the via holes 34a and 35a to the upper electrode 31 and the lower electrode 32 of the ferroelectric capacitor structure 30 are formed.

To be more precise, as lithography and the subsequent dry etching, the work which is applied to the second interlayer insulating film 33 until a part of the surface of the upper electrode 31 is exposed and the work which is applied to the second interlayer insulating film 33 until a part of the surface of the lower electrode 32 is exposed are simultaneously carried out, and the via holes 34a and 35a with the diameters of about 0.5 µm, for example, are simultaneously formed in the respective regions. At the time of formation of these via holes 34a and 35a, the upper electrode 31 and the lower electrode 32 respectively become the etching stoppers.

Next, annealing treatment for repairing the damage which is given to the ferroelectric capacitor structure 30 by the various steps after formation of the ferroelectric capacitor structure 30 is performed. In this case, the annealing treatment at the treatment temperature of 500° C. under the oxygen atmosphere for 60 minutes is carried out.

Figure 3A:
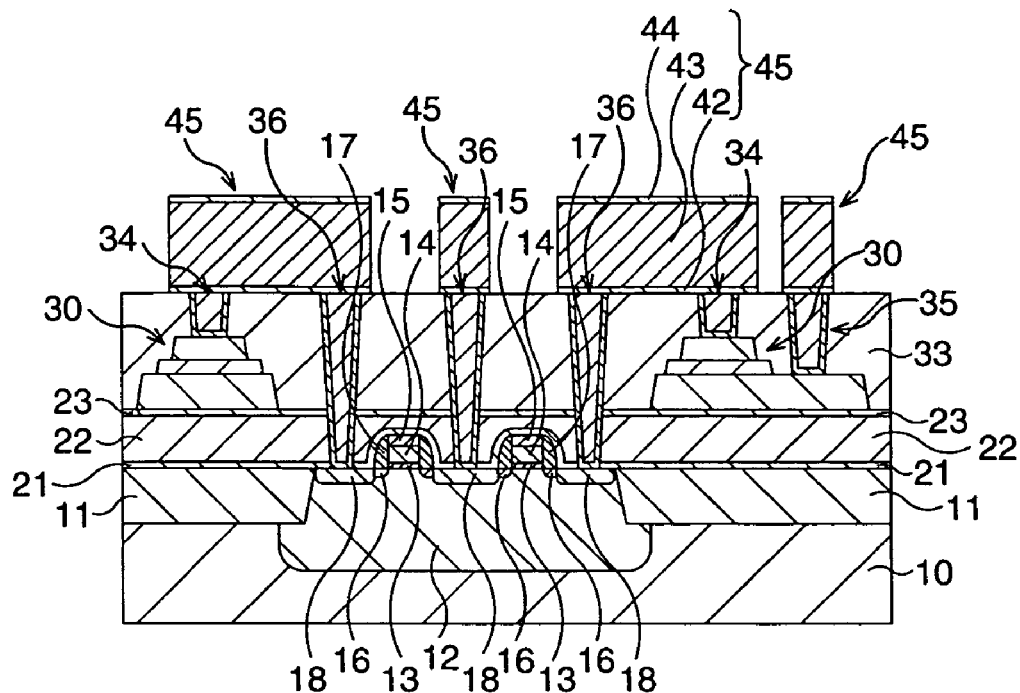
FIGS. 3A and 3B are schematic sectional views showing the constitution of the planar type FeRAM with its manufacturing method in sequence of steps, which continue from FIGS. 2A to 2D.

Subsequently, as shown in FIG. 3A, a first wiring 45 is formed.

To be more precise, a barrier metal film 42, a wiring film 43 and a barrier metal film 44 are deposited on the entire surface first. As the barrier metal film 42, for example, a Ti film (film thickness of about 60 nm) and a TiN film (film thickness of about 30 nm) are sequentially formed by the sputtering method. At this time, the barrier metal film 42 is formed so as to cover the inner wall surfaces of the via holes 34a and 35a. As the wiring film 43, for example, an Al alloy film (Al—Cu film in this case) is formed with the film thickness of about 360 nm. At this time, the via holes 34a and 35a are filled with the Al alloy film (Al—Cu film in this case) via the barrier metal film 42. In the example shown in the drawings, the portions of the wiring film 43, where the via holes 34a and 35a are filled with the Al alloy film are shown as via portions 34 and 35. As the barrier metal film 44, for example, a Ti film (film thickness of about 5 nm) and TiN film (film thickness of about 70 nm) are sequentially formed by the sputtering method. In this case, the structure of the wiring film 43 is the same structure as that of a logic part, other than FeRAM, of the same rule, and therefore, there is no problem in working the wiring and reliability.

Next, after, for example, an SiON film (not shown) is formed as a reflection preventing film, the reflection preventing film, the barrier metal film 44, the wiring film 43 and the barrier metal film 42 are worked into the wiring shape by lithography and the subsequent dry etching, and the first wiring 45 is formed by patterning. Instead of forming the Al alloy film as the wiring film 43, a Cu film (or a Cu alloy film) is formed by utilizing a so-called damascene method or the like, and the Cu wiring may be formed as the first wiring 45.

Figure 3B:
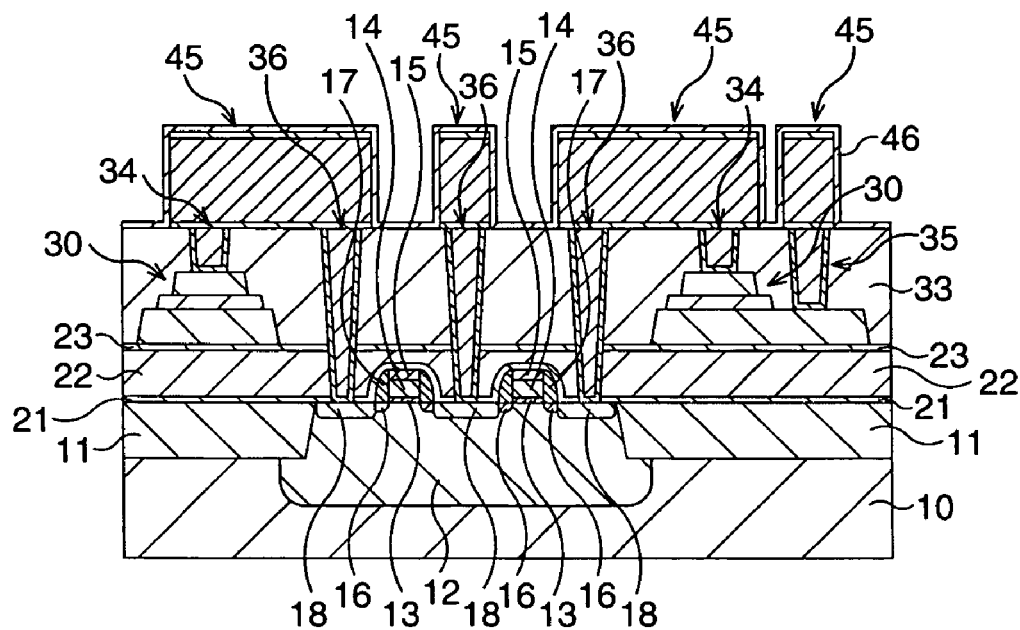

Subsequently, as shown in FIG. 3B, a protection film 46 for preventing characteristic degradation of the ferroelectric capacitor structure 30 is formed.

To be more precise, the protection film 46 is formed on the second interlayer insulating film 33 in such a manner as to cover the first wiring 45. The protection film 46 is for suppressing a damage caused to the ferroelectric capacitor 30 by the multilayer process after formation of the ferroelectric capacitor structure 30, and is formed to have the film thickness of about 20 nm by, for example, the sputtering method with, a metal oxide film, for example, alumina as a material.

Figure 4:
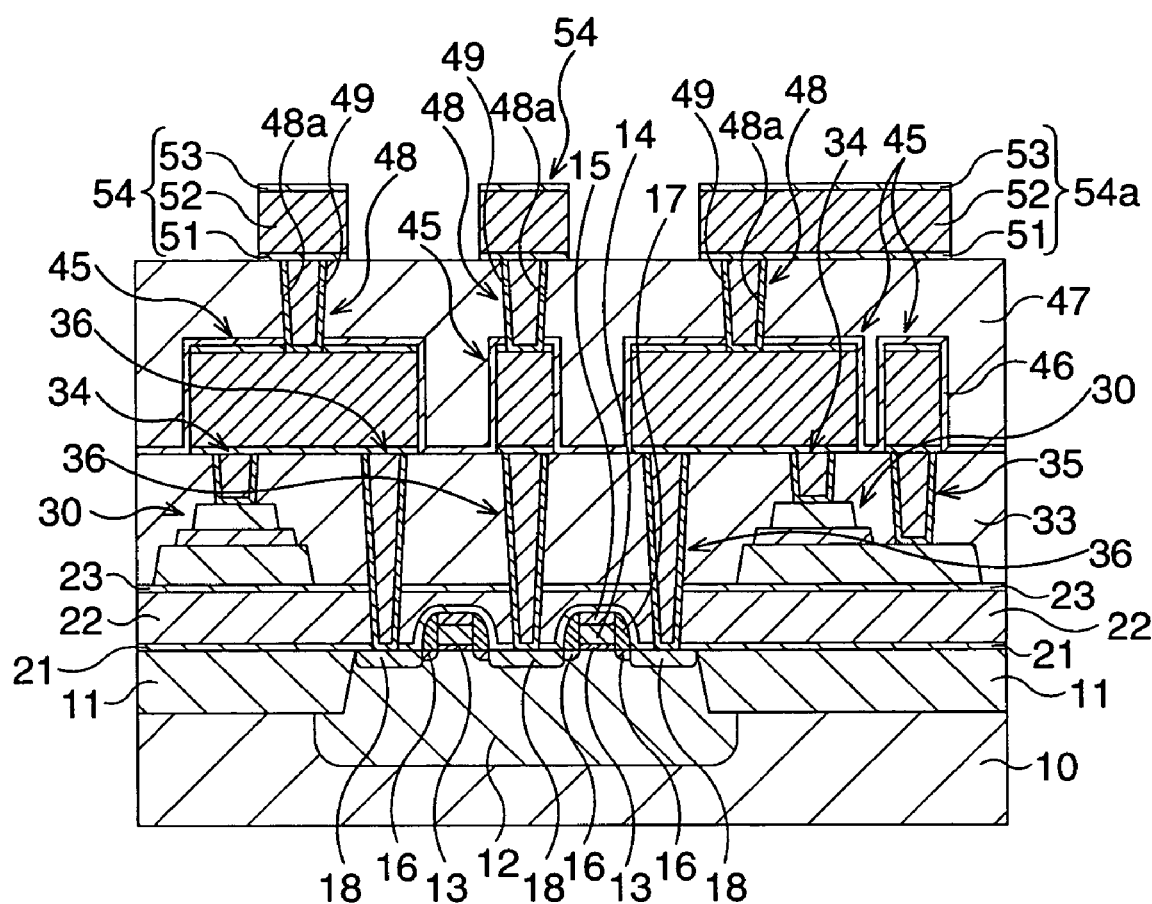
FIG. 4 is a schematic sectional view showing the constitution of the planar type FeRAM with its manufacturing method in sequence of steps, which continue from FIGS. 3A and 3B.

Subsequently, as shown in FIG. 4, a second wiring 54 which is connected to the first wiring 45 is formed.

To be more precise, a third interlayer insulating film 47 is first formed to cover the wiring 45 via the protection film 46.

As the third interlayer insulating film 47, a silicon oxide film is formed with the film thickness of about 700 nm, and plasma TEOS is formed to make the film thickness about 1100 nm as a whole, after which, the surface is polished by CMP to form the film thickness to be about 750 nm.

Next, plugs 48 which are connected to the wiring 45 are formed.

The third interlayer insulating film 47 and the protection film 46 are worked by lithography and the subsequent dry etching until a part of the surface of the wiring 45 is exposed, and via holes 48a each with the diameter of, for example, about 0.25 µm are formed. Next, after a base film (glue film) 49 is formed to cover the wall surfaces of the via holes 48a, a W film is formed to fill the via holes 48a via the glue film 49 by the CVD method. For example, the W film and the glue film 49 are polished with the third interlayer insulating film 47 as a stopper to form the plugs 48 with the via holes 48a filled with W via the glue film 49.

Next, the second wiring 54 which is connected to the plugs 48 respectively is formed.

A barrier metal film 51, a wiring film 52 and a barrier metal film 53 are deposited on the entire surface first by the sputtering method or the like. As the barrier metal film 51, for example, a Ti film (film thickness of about 60 nm) and a TiN film (film thickness of about 30 nm) are sequentially formed by the sputtering method. As the wiring film 52, for example, an Al alloy film (Al—Cu film in this case) is formed with the film thickness of about 360 nm. As the barrier metal film 53, for example, a Ti film (film thickness of about 5 nm) and a TiN film (film thickness of about 70 nm) are sequentially deposited by the sputtering method. In this case, the structure of the wiring film 52 is the same structure as that of the logic part other than the FeRAM of the same rule, and therefore, there is no problem in working the wiring and reliability.

Next, after, for example, an SiON film (not shown) is formed as a reflection preventing film, the reflection preventing film, the barrier metal film 53, the wiring film 52 and the barrier metal film 51 are worked into the wiring shape by lithography and the subsequent dry etching to form the second wiring 54 by patterning. As the wiring film 52, a Cu film (or Cu alloy film) may be formed by utilizing a so-called damascene method or the like instead of forming the Al alloy film, and a Cu wiring may be formed as the second wiring 54.

From the silicon semiconductor substrate 10 with the memory cell of the FeRAM, the peripheral circuits and the like formed above as described above, a package structure is formed as follows.

Figure 5:
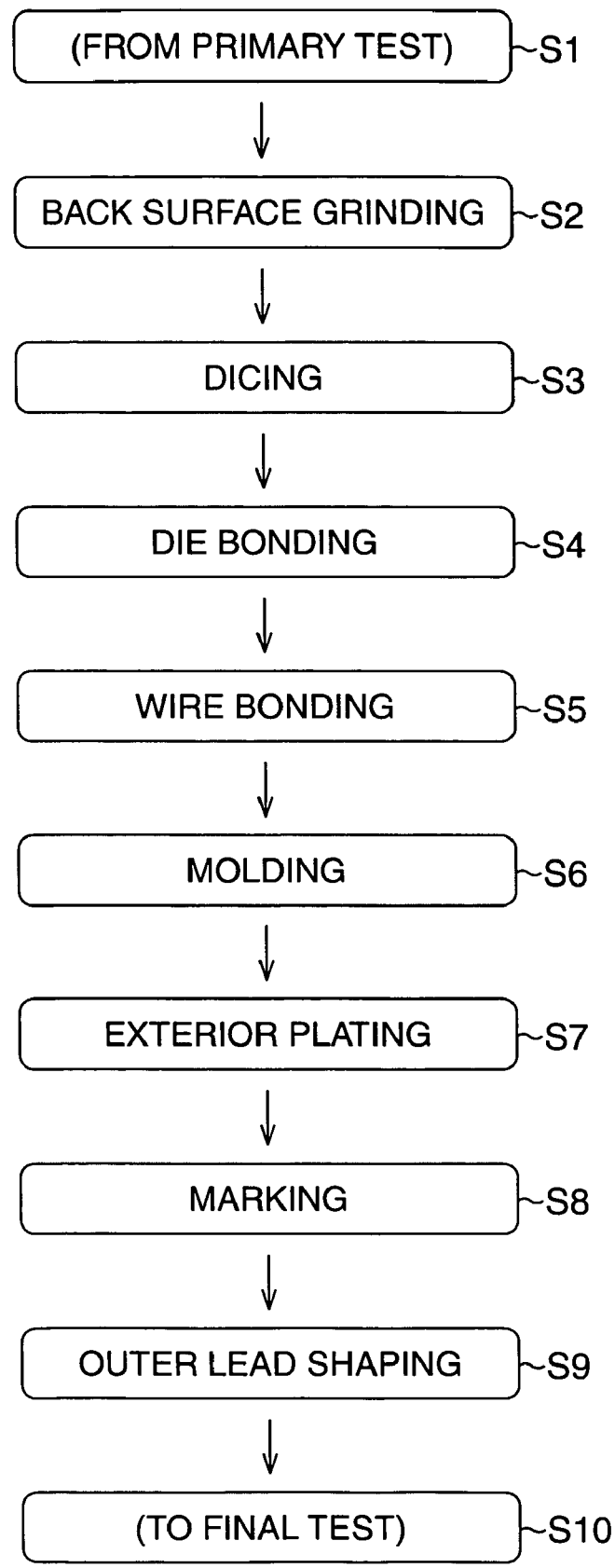
FIG. 5 is a flow chart showing respective steps for forming a package structure in a first embodiment.

FIG. 5 is a flow chart showing each step for forming the package structure. FIGS. 6A to 6G are schematic views showing states in which the respective steps in FIG. 5 are carried out. FIGS. 7A to 7d and FIGS. 8a and 8b are schematic plane views showing states of a semiconductor chip in predetermined steps of the respective steps in FIGS. 6A to 6G.

At the beginning, a predetermined electric test (primary test) is performed for the silicon semiconductor substrate 10 with the FeRAM completed, and thereafter, production of the package structure is started (step S1).

The silicon semiconductor substrate 10 is adjusted to the thickness suitable for packaging first (step S2).

Figure 6A:
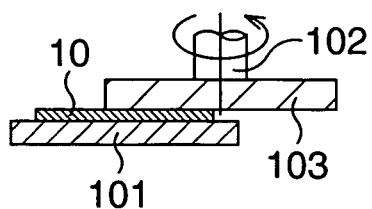
FIGS. 6A to 6G are schematic views showing states of carrying out the respective steps in FIG. 5.

To be more precise, as shown in FIG. 6A, the silicon semiconductor substrate 10 is placed and fixed onto a polishing stage 101 so that the back surface is exposed, and while a grind stone 103 is being rotated in, for example, the arrow direction by a spindle 102, the back surface of the silicon semiconductor substrate 10 is polished by the grind stone 103 to adjust the silicon semiconductor substrate 10 to a desired thickness.

Subsequently, individual semiconductor chips are cut out and separated from the silicon semiconductor substrate 10 (step S3).

Figure 6B:
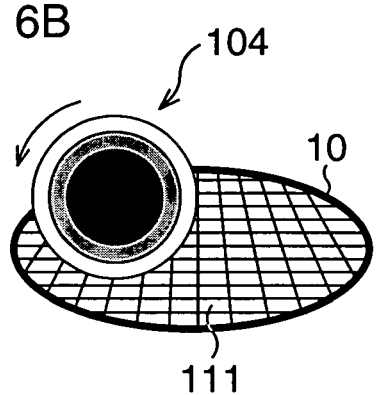

To be more precise, as shown in FIG. 6B, by using a dicing blade 104, the dicing blade 104 is rotated in, for example, the arrow direction along a scribe line 10a of the silicon semiconductor substrate 10 to cut the silicon semiconductor substrate 10 to separate the individual semiconductor chips.

Subsequently, the semiconductor chip is bonded and fixed to a lead frame (step S4).

Figure 6C:
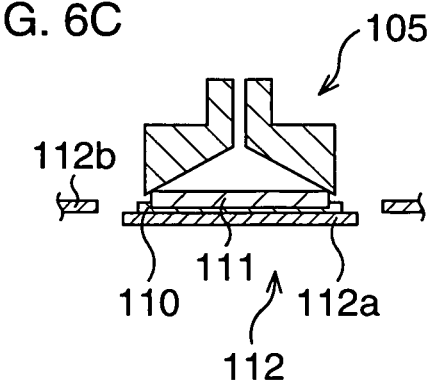

To be more precise, as shown in FIG. 6C, by using a die collet 105, the semiconductor chip 111 is bonded and fixed to a stage 112a of a lead frame 112 by, for example, an Ag paste 110. The state of the semiconductor chip 111 which is bonded and fixed to the die pad 112a of the lead frame 112 is shown in FIG. 7A. In this manner, the semiconductor chips 111 are respectively fixed in parallel to a plurality of die pads 112a provided at the lead frame 112.

Subsequently, the semiconductor chips and inner leads are connected by the wire bonding method (step S5).

Figure 6D:
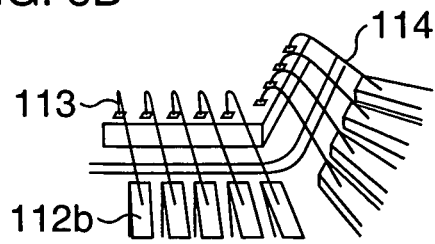

To be more precise, as shown in FIG. 6D, a pad electrode 113 exposed from the surface of the semiconductor chip 111 which is bonded and fixed to the die pad 112a of the lead frame 112 and the inner (inside) lead 112b of the lead frame 112 are electrically connected by the wire bonding method by using a metal wire 114. The state in which the semiconductor chips 111 and the inner leads 112b are connected by the metal wires 114 is shown in FIG. 7B.

In this embodiment, the treatment temperature at the time of wire bonding is set at 220° C. or lower, for example, at 210° C. The treatment temperature is normally set at about 230° C., but in this embodiment, characteristic degradation of the ferroelectric capacitor 30 can be suppressed to a minimum by setting the treatment temperature at the relatively low temperature of 220° C. or lower.

Subsequently, the semiconductor chips 111 are molded (step S6).

Figure 6E:
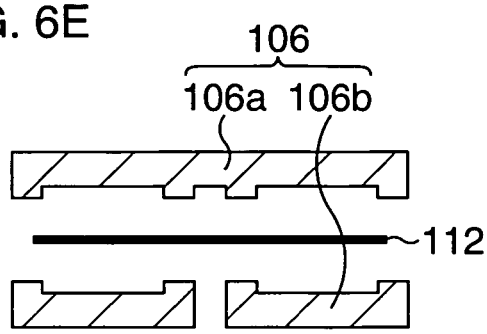

To be more precise, as shown in FIG. 6E, by using a mold 106 including an upper mold 106a and a lower mold 106b, the lead frame 112 to which the semiconductor chips 111 are fixed is sandwiched by the upper mold 106a and the lower mold 106b. The state of the lead frame 112 placed on the mold 106 is shown in FIG. 7C. In the example shown in the drawing, the lead frame 112 is shown to be seen through the mold 106.

Next, a sealing resin is poured from a resin poring port 106c provided at the mold 106 to carry out the procure treatment. The state in which the sealing resin 115 flows into the mold 106 is shown in FIG. 7D.

As the sealing resin used in this embodiment, a sealing resin with the filler content set at a value in the range of 90 weight % to 93 weight %, for example, set at 91 weight % in this case is used. The higher the filler content in the sealing resin, the smaller the solvent amount existing in the sealing resin. Thereby, the amount of water/hydrogen/gas which evaporate at the time of cure of the sealing resin which will be described later decreases, and therefore, characteristic degradation of the ferroelectric capacitor 30 is not caused.

The sealing resin contains one that is selected from a group constituted of an epoxy resin, a biphenyl resin and a polyfunctional resin. As the epoxy resin, an ordinary polymer having epoxy radical, which is one selected from, for example, bisphenol epoxy resin, cresol-novolak epoxy resin, phenol-novolak epoxy resin, trifunctional epoxy resin (for example, triphenolxenethane epoxy resin and alkyl-modified triphenolmethane epoxy resin) and triazine nucleus containing epoxy resin is used.

The filler of the sealing resin used in this embodiment is one that is selected from a group constituted of silicon oxide ($SiO_2$, $SiO$ or the like), aluminum nitride, boron nitride, aluminum borate, aluminum oxide, magnesium oxide and diamond. As the filler, a globular filler is preferably used. Use of a globular filler reduces a damage to the surface of the semiconductor chip 111 on the occasion of pouring the sealing resin, and enhances flowability into the mold 106, and even the sealing resin with a high filler content easily flows.

As the globular fillers, those with the diameters of 10 μm or less are preferable, and those with a uniform particle size and those with not less than two different kinds of particle sizes can be used. As the latter, for example, as two kinds of globular fillers differing in size, the fillers in which the diameter of the globular filler in a small size is substantially 0.35 times as large as the diameter of the globular filler in a large size, and the abundance ratios of the globular fillers in the small size and the globular fillers in the large size in the sealing resin are substantially the same are preferable. Further, the sealing resin in which not less than 99% of all the globular fillers have the diameters within the range of 3 μm to 9 μm may be used.

By using the sealing resin containing the globular fillers as described above, gaps between the fillers are reduced as much as possible. Therefore, influence of water entering the gaps decreases, and therefore, expansion of the sealing resin itself can be suppressed. By suppressing the expansion, compression (or contraction) stress is reduced.

On the occasion of pouring the above described sealing resin into the mold 106, the temperature of the mold 106 is set at 140° C. to 170° C., at 155±5° in this case. If the surface of the mold 106 is at a high temperature (175±5° C. in the prior art) here, the adverse effect of curing the surface of the poured sealing resin in a short time occurs, and occurrence of a crack is caused. In this embodiment, by setting the temperature of the mold 106 at the low temperature as described above, occurrence of a crack can be prevented without losing flowability of the sealing resin in a short time.

The pressure at which the sealing resin is poured into the mold 106 is set at 75 kg/cm² or higher, at 80 kg/cm² in this case. By setting the pressure at which the sealing resin is poured into the mold 106 at the relatively high value like this, the filler content in the sealing resin is increased, whereby even if the viscosity of the sealing resin increases, the sealing resin can be sufficiently supplied to the end of the inside of the mold 106, and reduction in yield at the time of packaging can be avoided. If the pouring pressure is made too high, the adverse effect of inclining the die pad 112a or the like occurs, and therefore, the pressure is adjusted to an appropriate pressure.

Figure 6F:
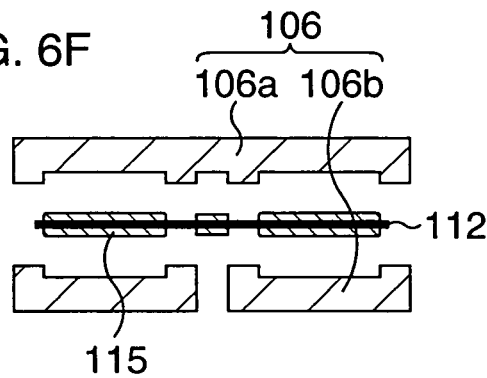

Next, as shown in FIG. 6F, the lead frame with the semiconductor chips 111 covered with the sealing resin 115 is removed from the mold 106. The state of the lead frame 112 which is taken out of the mold 106 is shown in FIG. 8A.

Then, the cure treatment for the sealing resin 115 of the lead frame 112 is carried out.

Figure 9:
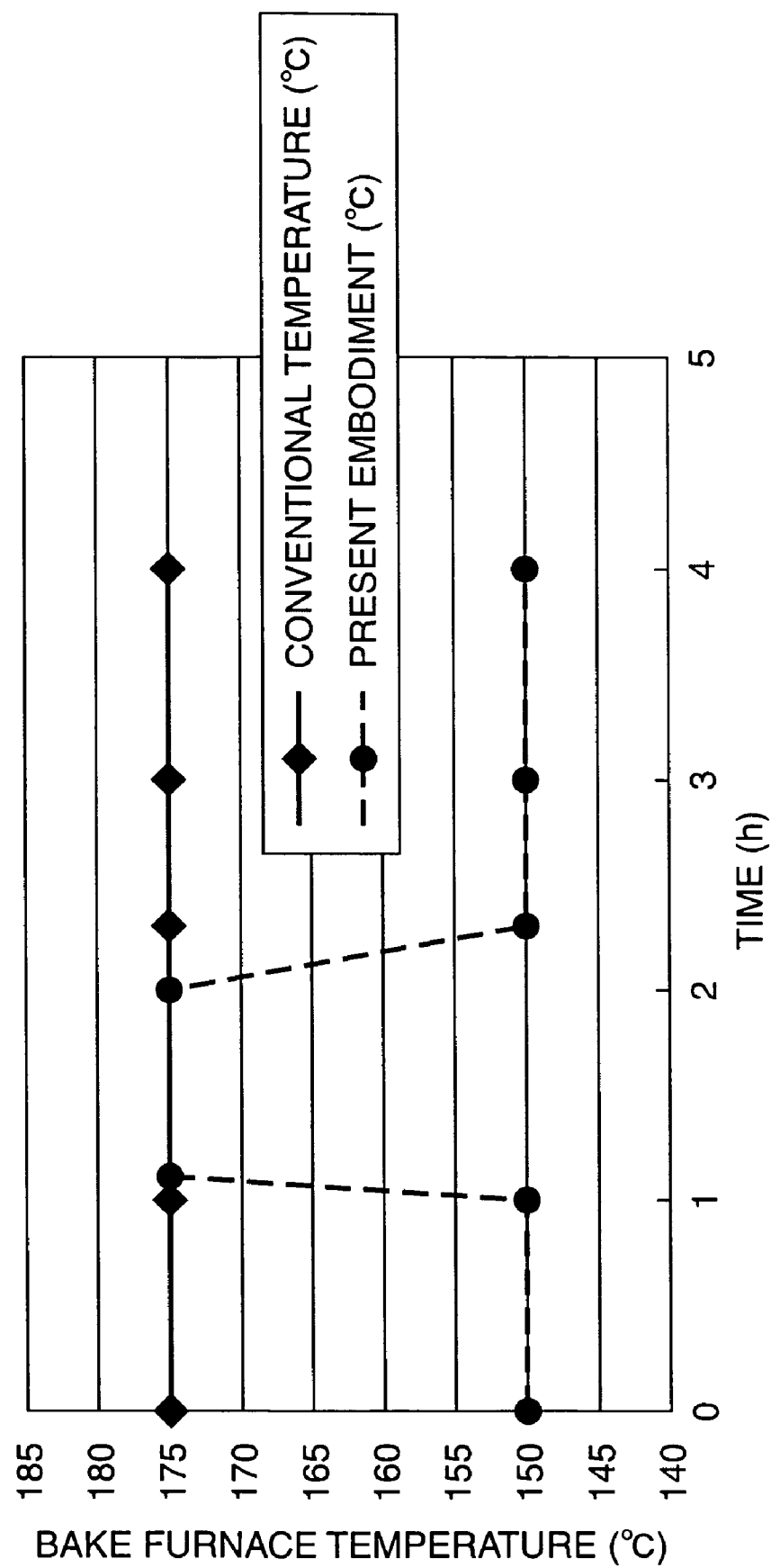
FIG. 9 is a characteristic chart showing temperature setting at a time of curing treatment of a sealing resin.

When the sealing resin low in filler content, containing, for example, 60 weight % to 70 weight % of fillers is used as shown in FIG. 9, the cure treatment for about four to five hours at 175±5° C. is performed to sufficiently evaporate a relatively large amount of solvent, but in this embodiment, the cure treatment of about two hours at 150° C. is carried out first, then the cure treatment of about one hour at 175° C. is carried out, and the cure treatment of about one hour at 150° C. is carried out in sequence.

In order to aim at perfection of the cross-linking reaction in the sealing resin, thermal treatment of about one hour at 175° C. is required, and by the thermal treatment in the remaining time, water and gases existing inside the sealing resin are discharged. In the ferroelectric, the thermal treatment at high temperature becomes the factor which promotes the reducing reaction. Therefore, in this embodiment, in order to complete the cross-linking reaction in the sealing resin 106, the thermal treatment of about one hour at 175° C. is carried out, and the thermal treatment at a relatively low temperature (150° C. in this case) is carried out respectively before and after the thermal treatment with a view to discharging the water and gases existing inside the sealing resin 115.

Figures 10A, 10B, 10C:
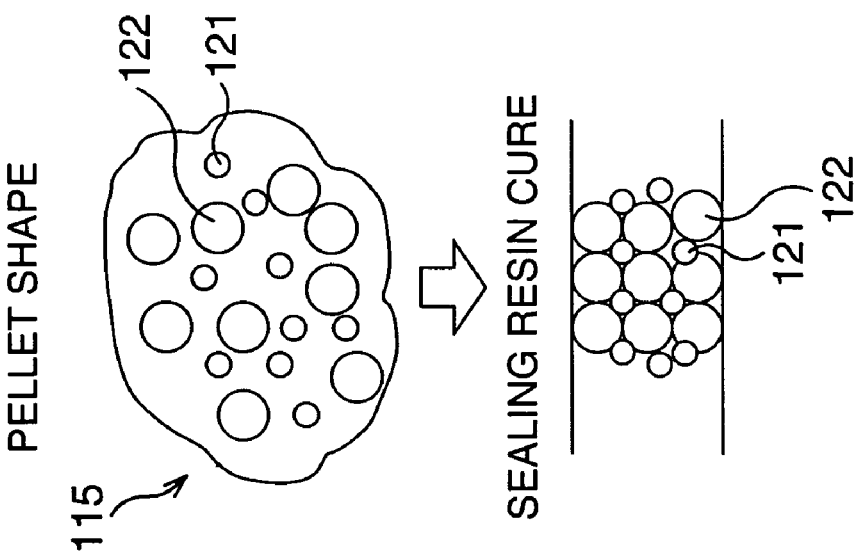
FIGS. 10A to 10C are schematic views showing states in which pellet-shaped sealing resins are thermally cured.

Here, the state in which the pellet-shaped sealing resin 115 is thermally cured is shown in FIGS. 10A to 10C. Here, FIG. 10A shows the sealing resin 115 containing three kinds of globular fillers 116 to 118 differing in size, FIG. 10B shows the sealing resin 115 containing globular fillers 119 in a single size, and FIG. 10C shows the sealing resin 115 in which as two kinds of globular fillers differing in size, the diameter of a globular filler 121 in a small size is substantially 0.35 times as large as the diameter of a globular filler 122 in a large size, and the abundance ratios of the globular fillers 121 and the globular fillers 122 in the sealing resin are substantially the same.

Subsequently, in order to facilitate soldering at the time of mounting, solder plating is applied to outer leads (outside lead) 112c of the lead frame 112 (step S7)

Subsequently, various kinds of markings are applied to the surface of the sealing resin 115 (step S8).

Figure 6G:

To be more precise, as shown in FIG. 6G, various kinds of markings, for example, markings of a company mark, a country of manufacture, a type and a grade, a lot number and the like are applied to the surface of the sealing resin 115 which covers each of the semiconductor chips 111.

Subsequently, individual pieces are cut from the lead frame 112 to be individual package structures (step S9).

The state of each of the cut package structures 100 is shown in FIG. 8B. Then, the outer leads 112c are shaped and assembly of the package structure 100 is completed.

Figure 11:
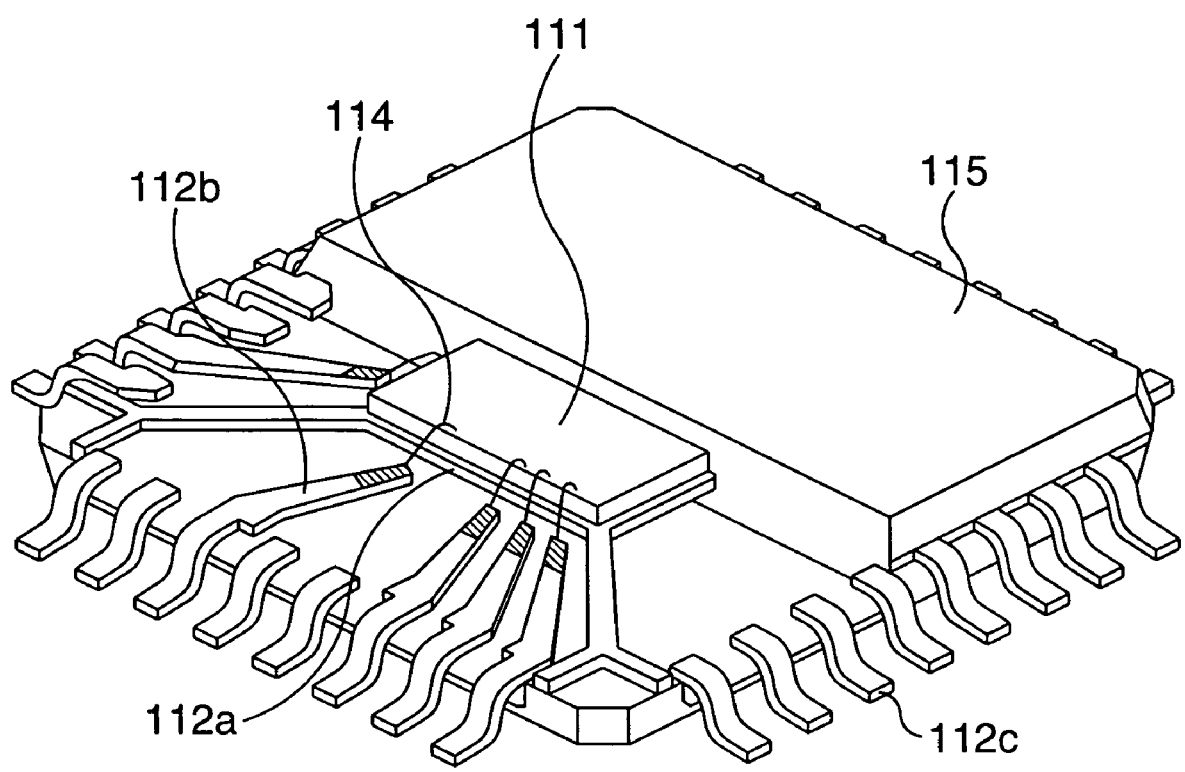
FIG. 11 is a schematic perspective view showing the package structure of completed TSOP of a first embodiment.

The completed package structure 100 of TSOP is shown in FIG. 11 (shown with a part removed for convenience).

In the package structure 100, the semiconductor chip 111 of the FeRAM is mounted and fixed onto the die pad 112a, and the semiconductor chip 111 and the inner leads 112b are bonded with the metal wires 114. The wire-bonded semiconductor chip 111 is formed into a structure in which it is molded up with the sealing resin 105, with the outer leads 112c projected from the end portions of the sealing resin 105.

Thereafter, the electrical test for the completed package structures 100 is performed (step S10), and the package structures 100 are shipped as the products.

Here, the PTHS characteristics (the present invention) of the package structure 100 of TSOP produced through the above described respective steps were investigated based on the comparison with the PTHS characteristics (prior art) of the package structure of the FeRAM of TSOP produced by using the conventional method, namely, by using the sealing resin with a low filler content (72 weight % in this case). In this case, the PTHS characteristics are the characteristics which are obtained from the test of confirming readability of data after leaving the package of the FeRAM with data written into the ferroelectric memory at a predetermined voltage (for example, 2.9 V) in the environment at 121° C. and 85% (for example, for 36 hours, 96 hours, 168 hours) as a moisture resistance test. The result is shown in the following Table 1.

TABLE 1

| | | PTHS CHARACTERISTICS ||||||
| | | 36 h || 96 h || 168 h ||
| KIND OF PKG | FILLER CONTENT | NUMBER OF DEFECTIVES/ EVALUATED NUMBER | DEFECTIVE RATE (%) | NUMBER OF DEFECTIVES/ EVALUATED NUMBER | DEFECTIVE RATE (%) | NUMBER OF DEFECTIVES/ EVALUATED NUMBER | DEFECTIVE RATE (%) |
|---|---|---|---|---|---|---|---|
| TSOP | PRIOR ART | 0/10 | 0 | 2/10 | 20 | 6/10 | 60 |
| TSOP | PRESENT INVENTION | 0/10 | 0 | 0/10 | 0 | 0/10 | 0 |

While in the prior art, the defective occurrence rate of the product increased as the product was left for a longer time, defective occurrence was not found in the present invention. Thus, it is found out that according to the present invention, the FeRAM is applied to TSOP that is a thin package structure, and the package structure excellent in the PTHS characteristics can be obtained.

As described thus far, according to this embodiment, the ultra-thin semiconductor chip of the FeRAM which is miniaturized and highly integrated with characteristic degradation of the ferroelectric capacitor suppressed though TSOP is applied to the FeRAM as the thin package structure can be realized.

Second Embodiment

In this embodiment, a semiconductor device in which FBGA (Fine pitch Ball Grid Array) that is a thin package structure (mounting height of 1.27 mm or less) is applied to an FeRAM and a manufacturing method of the same are disclosed.

In this embodiment, the silicon semiconductor substrate 10 with a memory cell of an FeRAM, peripheral circuits and the like formed through each of the steps in FIGS. 1A to 1D to FIG. 4 is produced as in the first embodiment, and thereafter, a package structure is formed as follows.

Figure 12:
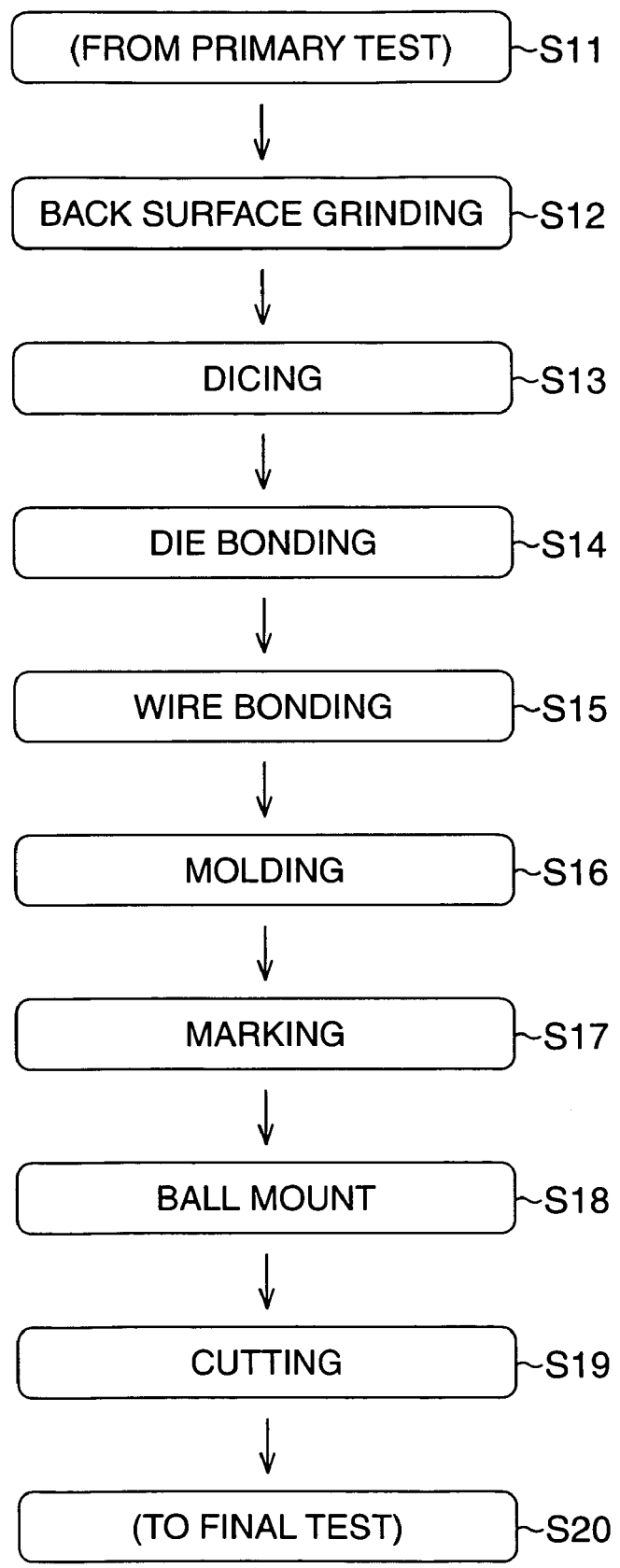
FIG. 12 is a flow chart showing respective steps for forming a package structure of a second embodiment.

FIG. 12 is a flow chart showing each step for forming the package structure. FIGS. 13A to 13D are schematic views showing states in which the respective steps in FIG. 12 are carried out.

First, through S11 to S13 which are the same as steps S1 to S3 in the first embodiment, the individual semiconductor chips are brought into the state where they are cut out and separated from the silicon semiconductor substrate 10.

Subsequently, the semiconductor chips are bonded and fixed to a package base board (step S14).

To be more precise, a plurality of semiconductor chips 111 are respectively bonded and fixed to, for example, a rectangular package base board with a conductive adhesive, for example, an Ag paste.

Subsequently, the semiconductor chips and the package base board are connected by the wire bonding method (step S15).

In this embodiment, the treatment temperature at the time of wire bonding is set at 220° C. or lower, for example, at 210° C. Normally, the treatment temperature is set at about 230° C., but in this embodiment, by setting the treatment temperature at the relatively low temperature of 220° C. or lower, characteristic degradation of the ferroelectric capacitor 30 can be suppressed to a minimum.

Subsequently, the semiconductor chips 111 are molded (step S16).

Figure 13A:
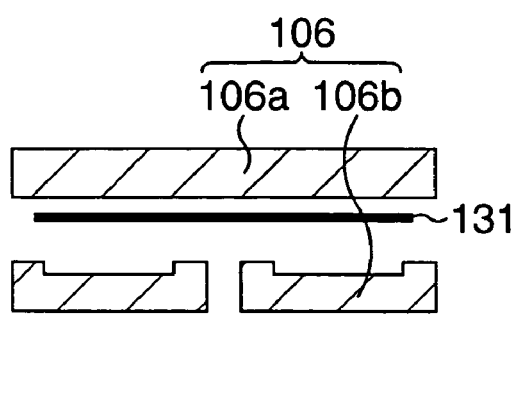
FIGS. 13A to 13D are schematic views showing states of carrying out the respective steps in FIG. 12.

To be more precise, as shown in FIG. 13A, by using the mold 106 including the upper mold 106a and the lower mold 106b, the package base board 131 to which the semiconductor chips 111 are fixed are sandwiched with the upper mold 106a and the lower mold 106b.

Next, a sealing resin is poured from the resin poring port 106c provided at the mold 106, and a precure treatment is carried out. In this embodiment, the sealing resin 115 is formed on only one side surface of the package base board 131 to cover the semiconductor chip 111. In this case, the composition of the sealing resin 115, the temperature setting of the mold 106, the pouring pressure of the sealing resin and the like are the same as the first embodiment.

Figure 13B:
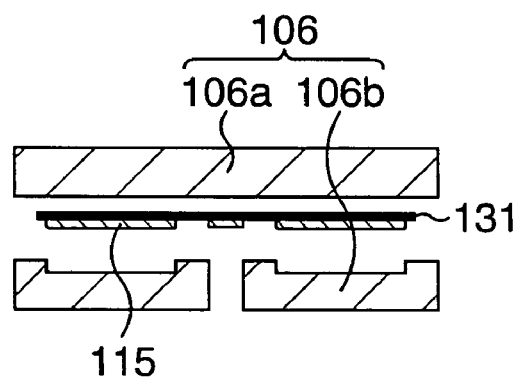

Next, as shown in FIG. 13B, the package base board 131 with the semiconductor chips 111 covered with the sealing resin 115 (the sealing resin 115 is formed on only one side surface) is removed from the mold 106, and a cure treatment is applied to the sealing resin 115 under the same conditions as in the first embodiment.

Subsequently, various kinds of markings of, for example, markings of a company mark, a country of manufacture, a type and a grade, a lot number and the like are applied to the surface of the sealing resin 115 (step S17).

Figure 13C:
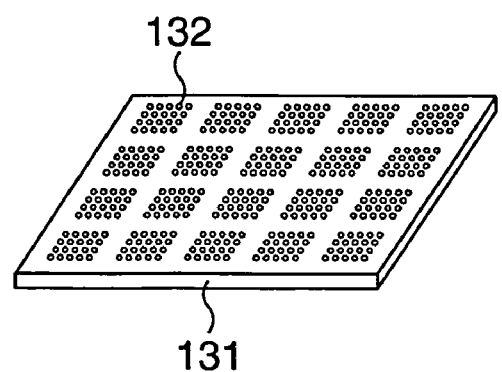

Subsequently, as shown in FIG. 13C, a solder ball 132 is mounted on each of the electrodes of the package base board 131 (step S18).

Subsequently, individual pieces are cut from the package base board 131 to form the individual package structures (step S19).

Figure 13D:
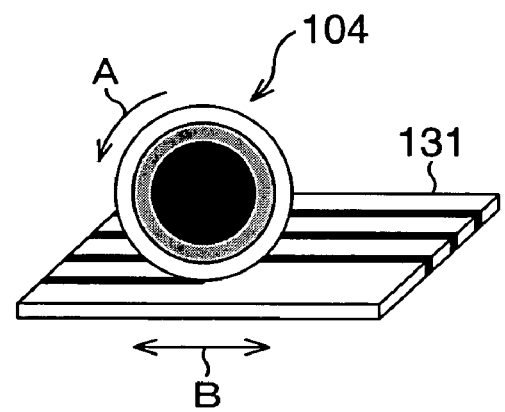

To be more precise, as shown in FIG. 13D, with use of the dicing blade 104, while the dicing blade 104 is rotated in the direction of the arrow A, for example, and the package base board 131 is moved in the direction of the arrow B, the package base board 131 is cut, and individual package structures 200 are separated.

Thereafter, the electrical test is performed for the complete package structures 200 (step S20), and the package structures 200 are shipped as products.

As described thus far, according to this embodiment, the ultra-thin semiconductor chip of a FeRAM which is miniaturized and highly integrated with characteristic degradation of the ferroelectric capacitor suppressed even though FBGA is applied to the FeRAM as the thin package structure can be realized.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
a semiconductor chip comprising a memory cell including a ferroelectric capacitor having a ferroelectric film sandwiched between two electrodes; and
a sealing resin covering said semiconductor chip,
wherein said semiconductor device has a thin package structure with a mounting height of 1.27 mm or less,
wherein said sealing resin has a filler content of 90 weight % or more, and
wherein the fillers comprise not less than two kinds of globular fillers differing in size, which have diameters in a range of 3 μm to 9 μm.

2. The semiconductor device according to claim 1, wherein said sealing resin has the filler content set at a value in a range of 90 weight % to 93 weight %.

3. The semiconductor device according to claim 1, wherein said sealing resin contains one that is selected from a group constituted of an epoxy resin, a biphenyl resin and a multifunctional resin.

4. The semiconductor device according to claim 1, wherein the filler is one that is selected from a group constituted of silicon oxide, aluminum nitride, boron nitride, aluminum borate, aluminum oxide, magnesium oxide and diamond.

5. The semiconductor device according to claim 1, wherein the fillers comprise two kinds of globular fillers differing in size,
a diameter of a globular filler in a small size is substantially 0.35 times as large as a diameter of a globular filler in a large size, and abundance ratios of the globular fillers in the small size and the globular fillers in the large size in said sealing resin are substantially the same.

6. The semiconductor device according to claim 1, wherein not less than 99% of all the globular fillers contained in said sealing resin have diameters in a range of 3 μm to 9 μm.

7. The semiconductor device according to claim 1, wherein said sealing resin contains a single kind of the fillers constituted of a same material, or a combination of not less than two kinds of the fillers constituted of different materials.

* * * * *